(12) United States Patent
Li et al.

(10) Patent No.: US 6,610,601 B2
(45) Date of Patent: Aug. 26, 2003

(54) BOND PAD AND WIRE BOND

(75) Inventors: Hugh Li, Santa Clara, CA (US); Diane J. Hymes, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/038,980

(22) Filed: Jan. 4, 2002

(65) Prior Publication Data

US 2002/0058417 A1 May 16, 2002

Related U.S. Application Data

(63) Continuation of application No. 09/282,596, filed on Mar. 31, 1999.

(51) Int. Cl.$^7$ .............................................. H01L 21/44
(52) U.S. Cl. ........................ 438/687; 438/681; 438/688
(58) Field of Search ................................ 438/687, 618, 438/622, 643, 653, 681, 688

(56) References Cited

U.S. PATENT DOCUMENTS

| | | |
|---|---|---|
| 4,370,173 A | 1/1983 | Dollman |
| 4,871,422 A | 10/1989 | Scardera et al. |
| 5,700,383 A | 12/1997 | Feller et al. |
| 5,709,755 A | 1/1998 | Kuo et al. |
| 5,714,203 A | 2/1998 | Schellenberger et al. |
| 5,794,299 A | 8/1998 | Gockel et al. |
| 5,806,126 A | 9/1998 | deLarios et al. |
| 5,810,938 A | 9/1998 | Murphy |
| 5,858,109 A | 1/1999 | Hymes et al. |
| 5,868,863 A | 2/1999 | Hymes et al. |
| 5,935,871 A | 8/1999 | Farkas et al. |
| 6,096,652 A | 8/2000 | Watts et al. |
| 6,207,559 B1 * | 3/2001 | Jiang ........................ 438/653 |

FOREIGN PATENT DOCUMENTS

| | | |
|---|---|---|
| EP | 0 368 334 | 5/1990 |
| EP | 0 805 484 | 11/1997 |
| EP | 0 812 011 | 12/1997 |
| EP | 0 859 404 | 8/1998 |
| EP | 0 871 209 | 10/1998 |
| EP | 0 878 831 | 11/1998 |
| WO | WO 93/10277 | 5/1993 |
| WO | WO 94/27314 | 11/1994 |
| WO | WO 97/13590 | 4/1997 |
| WO | WO 96/26538 | 9/1997 |
| WO | WO 96/21942 | 11/1997 |
| WO | WO 97/18582 | 10/1998 |

OTHER PUBLICATIONS

Database WPI, Section Ch, Week 197808, Derwent Publications Ltd., London, GB, an 1978–14699A, XP002143960 & JP 53 001654 A, Furukawa Electric Co. Ltd., Jan. 9, 1978, abstract.

Yiqi Feng et al., "Corrosion protection of copper by a self–assembled monolayer of alkanethiol", Journal of the Electrochemical Society, Jan. 1997, Electrochem. Soc, USA, vol. 144, No. 1, pp. 55–64, XP002143958.

Anonymous, "Protection of M1 Cu Surface Prior to M2 Evaporation. Nov. 1981" IBM Technical Disclosure Bulletin, vol. 24, No. 6, Nov. 1, 1981, p. 2989, XP002143959.

Database WPI, Section E1, Week 199531, Derwent Publications Ltd., London, GB, AN 1995–238055, XP00215984 & JP 07 147300 A, Hitachi Ltd., Jun. 6, 1995, abstract.

* cited by examiner

*Primary Examiner*—David Nelms
*Assistant Examiner*—Reneé R. Berry
(74) *Attorney, Agent, or Firm*—Martine & Penilla, LLP

(57) ABSTRACT

A method is described comprising removing an oxide from a surface and then commencing application of a passivation layer to the surface within 5 seconds of the oxide removal. The surface may be a copper surface which may further comprise a bonding pad surface. Removing the oxide may further comprise applying a solution comprising citric acid or hydrochloric acid. Applying the passivation layer may further comprise applying a solution comprising a member of the azole family where the azole family member may further comprise BTA. The method may also further comprise completely applying the passivation layer 35 seconds after commencing its application.

15 Claims, 4 Drawing Sheets

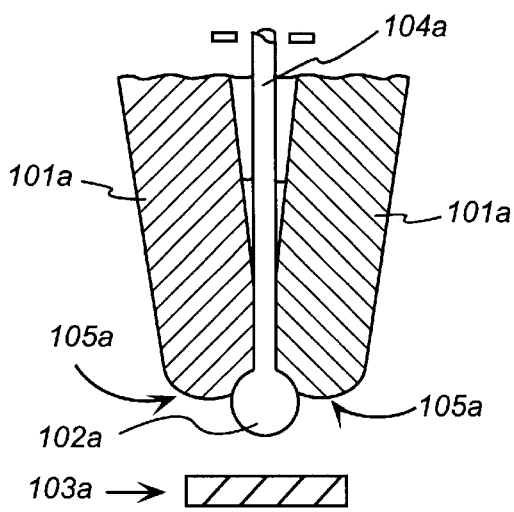
FIG. 1A
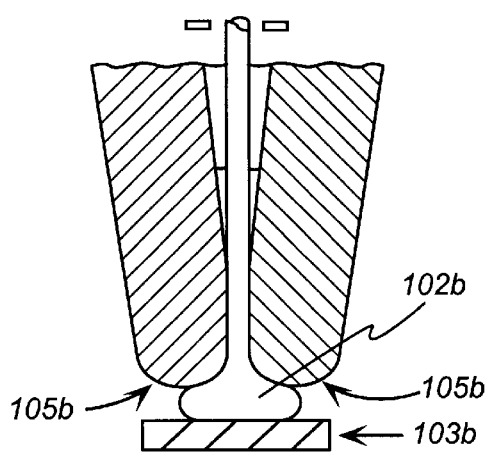
FIG. 1B
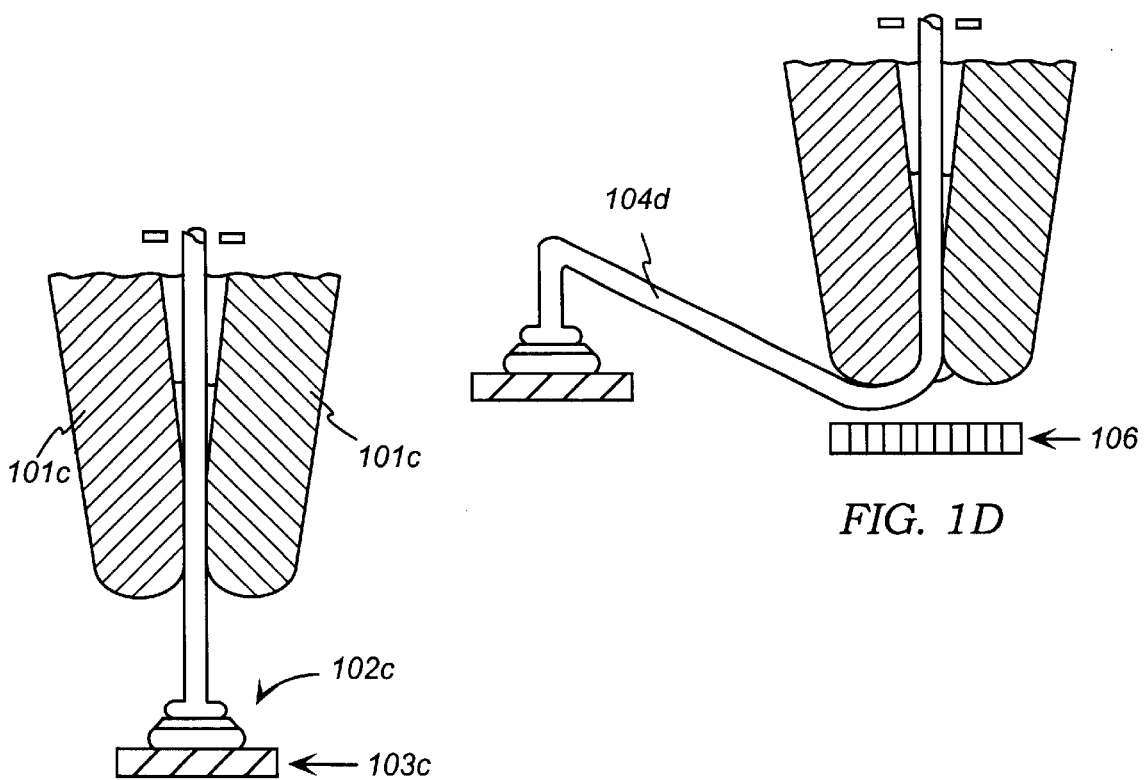
FIG. 1C
FIG. 1D

BOND PAD AND WIRE BOND

CROSS-REFERENCE TO RELATED APPLICATIONS

This application is a Continuation of application Ser. No. 09/282,596, filed Mar. 31, 1999, the disclosure of which is incorporated herein by reference.

FIELD OF INVENTION

The field of invention relates to thin film processing and, more specifically, to the field of processing techniques for semiconductor integrated circuits employing copper based metallization technology.

BACKGROUND OF THE INVENTION

In the manufacture of advanced semiconductor devices, copper (Cu) is beginning to replace aluminum (Al) as the material for metallization. Cu has become desirable due to its lower resistivity and significantly improved electromigration lifetime, when compared to Al.

A problem with Cu based metallurgy, however, involves the rate at which native oxides form on exposed regions of copper. In a free air ambient, it is reported that copper oxides grow 20 Angstroms (Å) within the first minute; while within water environments copper oxides grow 50 Å within the first minute. Frequently these native oxides are undesirable. That is, as the copper region is typically used to electrically interconnect various devices within an electrical circuit, the formation of the oxide represents an undesirable reduction of conductance. Thus, cleaning, ambient control and/or processing approaches unique to copper metallurgy based manufacturing processes are typically used to control mitigate, or at least limit, the effects of the oxide growth.

One particular problem area concerns bonding pads used for input/output (I/O) connections from the semiconductor chip to its associated package. Specifically, copper based metallization technologies having copper bonding pads experience bond quality problems which are caused by the growth of a relatively thick native oxide on the copper bond pad.

Typically, a wire is bonded as shown in FIG. 1. Referring to FIG. 1a, a capillary 101a threaded with a (typically Gold (Au) or Al) wire 104a having a ball 102a formed at the capillary tip 105a is centered over a chip's bond pad 103a and (referring now to FIG. 1b) pressed against the face of the bond pad 103b. Then, typically, either thermosonic or thermocompressive energy is applied at the capillary tip 105b to adhere the ball 102b to the bond pad 103b. As shown in FIGS. 1c and 1d, after the ball 102c is adhered to the bond pad 103c, the capillary 101c moves to a package lead 106 where the wire 104d is subsequently wedge bonded to the package lead 106.

Unfortunately, in standard manufacturing processes, a native oxide (not shown in FIG. 1a) forms over the copper bond pad 103a before the ball 102a makes contact with the pad 103a. The native oxide prevents a bond from forming between the wire and the underlying copper pad. Good bonds typically exhibit an intermetallic layer between the ball 102 and the bond pad 103.

As discussed, the native oxide is formed prior to the application of the ball 102 to the bond pad 103. Standard manufacturing processes typically form the bond pad structure immediately following the last (or highest) metallization layer of the interconnect structure of the semiconductor wafer. After the last metallization layer is formed, the metal layer is polished (e.g., by a Chemical Mechanical Polish (CMP)) to a specified thickness range.

After polishing, the semiconductor wafer is cleaned to remove unwanted particulates from the surface of the wafer, most of which result from the prior polishing steps. Native bond pad oxides formed after polishing and before cleaning may be removed by the cleaning process depending on the cleaning chemistry used. After cleaning, the semiconductor wafers are dried, tested and diced. Each individual die is then placed in a chip carrier and epoxied at elevated temperature to a die package before the wire bonding procedure commences.

The entire "post cleaning" process described above results in copper bond pad exposure to an oxygen based ambient/environment at room temperature as well as in an a thermal curing oven for substantial periods of time. As a result, it is difficult to prevent native oxide growth on the exposed bond pads without introducing costly complications to the standard manufacturing sequence just described (for example, one approach is to plasma etch and then deposit a relatively thick layer of another metal film, such as Ni; this would then be followed by a second deposition of palladium and/or gold).

Thus, a cost effective way of controlling the native oxide growth on the copper bond pads is needed.

SUMMARY OF THE INVENTION

A method and apparatus are described for removing an oxide from a surface and then commencing application of a passivation layer to the surface within 5 seconds of the oxide removal. The surface may be a copper surface which may further comprise a bonding pad surface. Removing the oxide may further comprise applying a solution comprising citric acid or hydrochloric acid. Applying the passivation layer may further comprise applying a solution comprising a member of the azole family where the azole family member may further comprise BTA. The method may also further comprise completely applying the passivation layer 35 seconds after commencing its application.

BRIEF DESCRIPTION OF THE DRAWINGS

The present invention is illustrated by way of example and not limitation in the figures of the accompanying drawings, in which like references indicate similar elements, and in which:

FIGS. 1A thru 1D show a typical wire bonding process.

DETAILED DESCRIPTION

Figure 2:
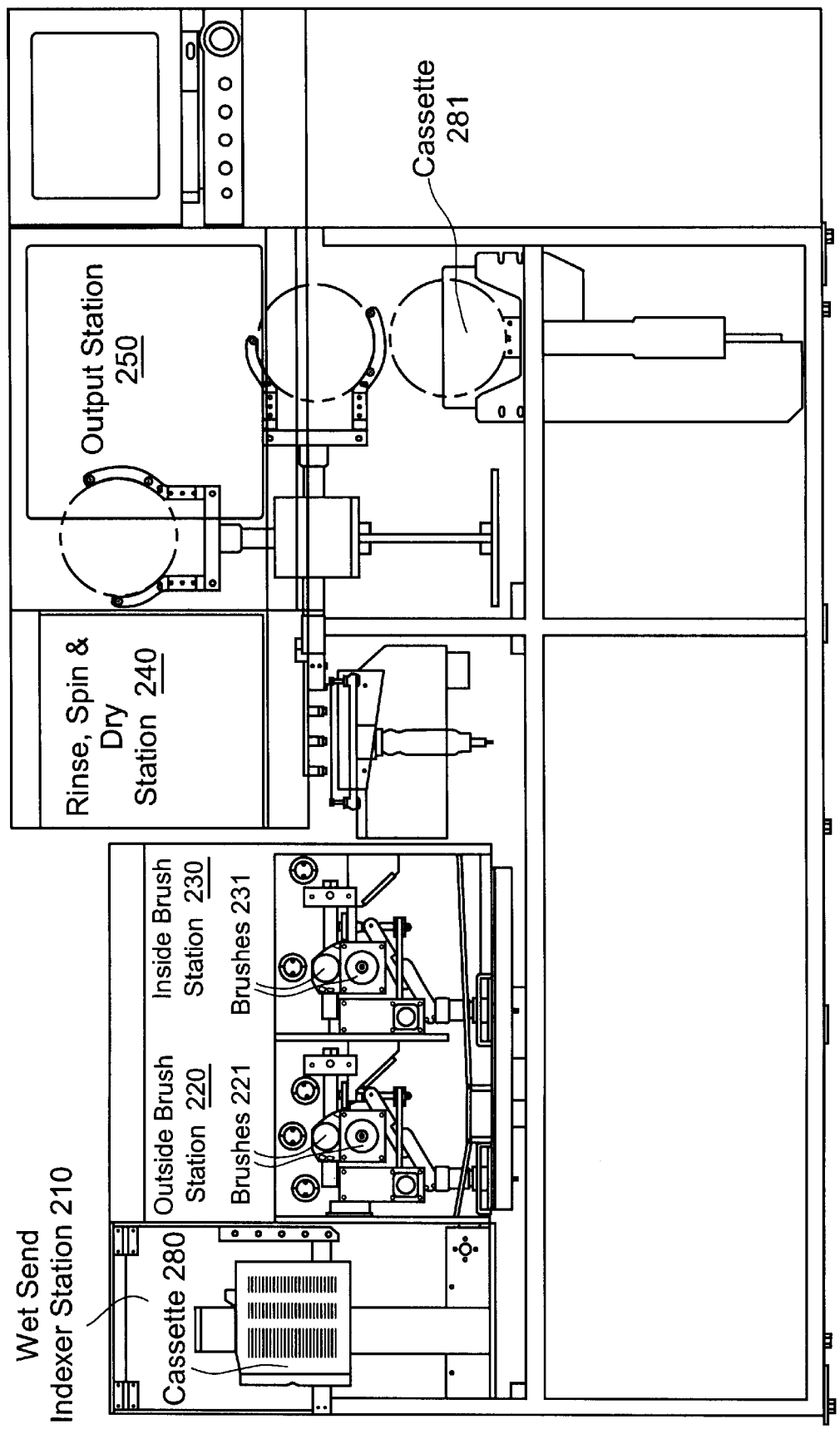
FIG. 2 shows an example of a brush scrubbing system.

Methods and apparatuses are described for processing wafers. In the following description, numerous details are set forth, such as distances between components, types of molding, etc. It will be apparent, however, to one skilled in the art, that the present invention may be practiced without these specific details. In other instances, well-known structures and devices are shown in block diagram form, rather than in detail, in order to avoid obscuring the present invention.

In one embodiment, the manufacturability and/or cost-of-ownership of copper based metallization technology are improved with the processing techniques described herein. As copper suffers from continuous oxide formation, methods and apparatuses described herein control the detrimental effects caused by the oxide growth.

In one embodiment, the processing of wafers includes removing an oxide from a surface and then commencing application of a passivation layer to the surface (e.g., a copper surface, a bonding pad surface, etc.). The oxide may be removed by applying a solution of either citric acid or hydrochloric acid to the surface. The passivation layer may be applied by applying a solution to the surface, where the solution is a member of the azole family (e.g., BTA, etc.). In one embodiment, the passivation layer is applied within 5 seconds of the oxide removal and is completed approximately 35 seconds after commencing its application.

In one embodiment, the application of the passivation layer is performed by the use of a brush and a liquid (e.g., a wet chemistry) supplied to a brush. Such a technique is equally applicable to the application of other layers as well. In one embodiment, the liquid reacts with the wafer surface to form the layer. In one embodiment, the brush may be part of a wafer processing system that is typically designed for brush scrubbing and the liquid is provided to the core of the brush for chemical delivery through the brush. Note that chemical delivery through the brush is not required and the liquid may be dripped, for example, onto the brush for application thereby.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention is measured only in terms of the claims.

For example, although the discussion below is directed mostly to copper based process technologies for semiconductor IC bond pads, it will be evident to those skilled in the art that the broader scope of the teachings herein may be applied to other technologies employing materials susceptible to aggressive and/or unwanted oxide formation. For example, magnetic recording or magneto optical based processes similarly involve transition metals (such as Iron, Cobolt and Nickel) or their alloys which may suffer from unwanted oxide film growth. Furthermore, the teachings herein may also be employed to semiconductor based processes using other materials (besides copper) that similarly suffer from aggressive or unwanted oxide growth. Further still, the teachings herein may also be applied to other packaging technologies (besides wire bonds), for example: flip chip technologies as well as ball grid arrays and pin grid arrays.

The bond pads are typically formed after the final layer of interconnect metallization is formed. Therefore, minimal amount of disruption is added to the manufacturing process by employing a brush scrubber after the post CMP wafer cleaning step to remove the oxide and deposit the passivation layer. A minimal amount of disruption to the overall manufacturing process may also result if the oxide removal and passivation layer application methods are performed either after the wafer is tested or just prior to wire bonding.

A brief explanation of a typical method used to clean a wafer with a brush scrubber is now described. FIG. 2 shows an exemplary brush scrubber (also referred to as a system). The scrubber includes a number of stations. Each of these stations typically represents one or more steps in the wafer cleaning process. Contaminated wafers (or substrates) are loaded at one end of the system and cleaned and dried substrates are unloaded from the other end of the system. That is, contaminated substrates are loaded into a wafer cassette 280 and the cassette 280 is then placed into the wet send index station 210. After cassette 280 is placed into the wet send indexer station 210 the substrates are automatically removed from the cassette 280 and placed, one at a time, into the outside brush station 220.

In the outside brush station 220, a substrate is processed through a first scrub. Typically, the substrate is treated with a solution (such as ammonium hydroxide ($NH_4OH$), HF or SCl) during the first scrub. The solution is applied to the substrate through the brushes 221. The substrate itself may rotate underneath brushes 221 to help apply the solution. Wafers usually traverse the brush stations 220, 230 via hardware that transport the wafer from one end of the brush station to the other.

The scrubbed substrate is then automatically removed from the outside brush station 220 and placed into the inside brush station 230. Most scrubbers are capable of transporting the wafer from the first to second station in 5 seconds or less. In the inside brush station 230, the substrate is processed through a second scrub. Again, the wafer is treated with another solution (for example, diluted hydrofluoric acid (HF)) during the second scrub. As in the first scrub step, the solution is applied to the substrate through brushes 231. After the second scrub the substrate is then automatically removed from the inside brush station 230 and placed into the rinse, spin and dry station 240. The substrate is then transported to the output station 250 and then placed into cassette 281.

Figure 3:
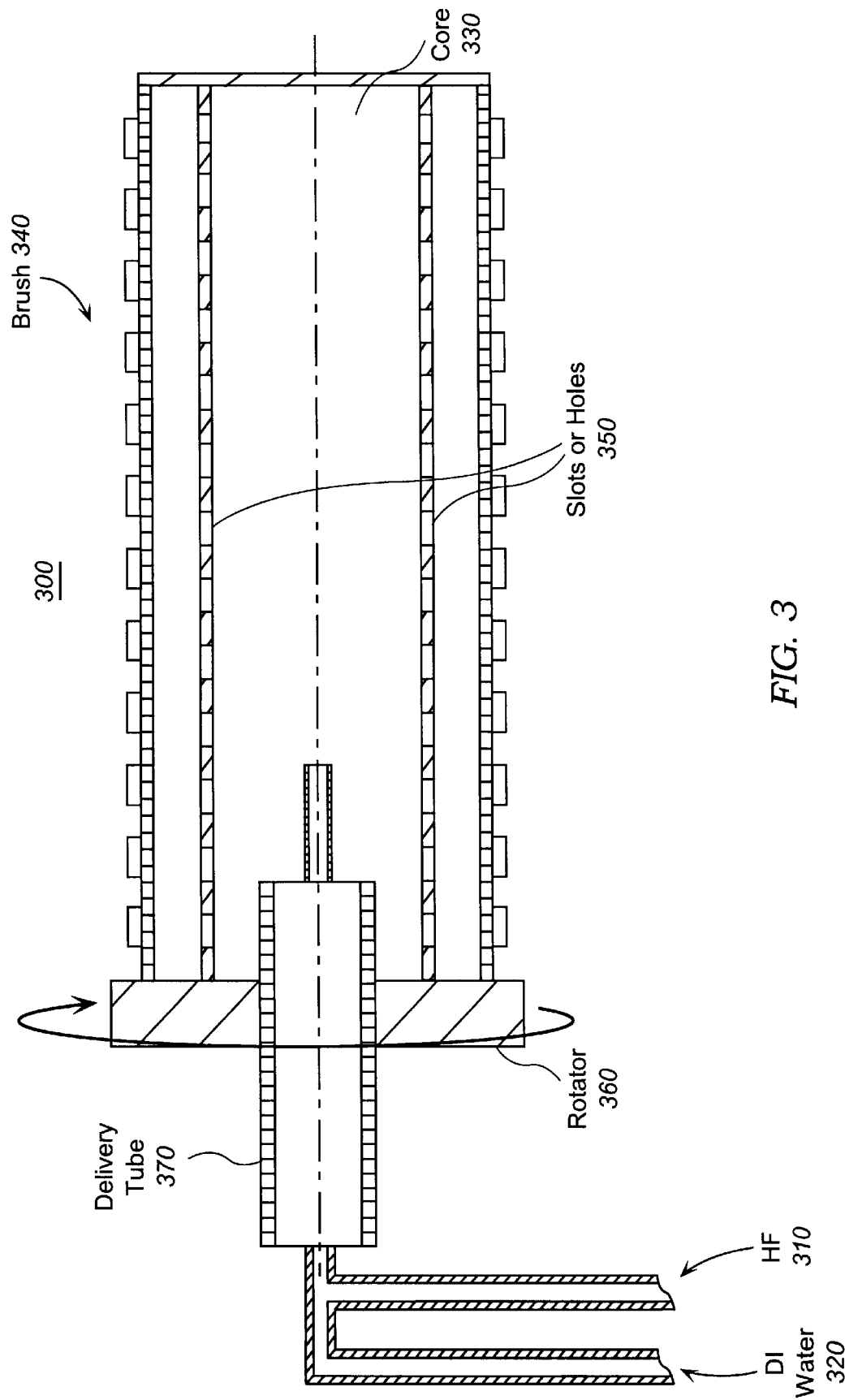
FIG. 3 shows an example of a brush used within the brush scrubbing system of FIG. 2.

An exemplary brushing apparatus 300 used for scrubbing wafers as well as applying various solutions is shown in FIG. 3. A solution is typically a mixture of more than one liquid (such as deionized (DI) water and an acid). The embodiment of FIG. 3 may supply liquids through supply lines 310 and 320. Various liquids may be applied sequentially, that is, one at a time; or in the alternative, at the same time. Supply lines 310 and 320 run into delivery tube 370. Delivery tube 370 delivers the solution into the hollow core 330 of the brush 340 at a predetermined flow rate. The supply lines 310 and 320 are therefore in fluid communication with the brush core 330. Usually, as brush 340 is being saturated with solution it is rotated by rotation device 360. Rotation device 360 turns brush 340 in a clockwise (or counterclockwise) manner, which applies the solution to the substrate through slots or holes 350. Because brush 340 is wet with solution, the solution which is brought in contact with the wafer is applied to the substrate. More details on brush scrubbing technology may be obtained from U.S. Pat. No. 5,868,863 entitled Method and Apparatus for Cleaning of Semiconductor Substrates Using Hydrofluouric Acid (HF).

Furthermore, other brush scrubbing equipment, rather than injecting liquid into the core of a brush, applies fluid over the brush or wafer. Therefore, such equipment also employs a wet brush which relatively uniformly applies solution to the wafer. Regardless of which type of equipment is employed (either a system that flows liquid through a brush or a system that applies liquid over a brush or wafer), both may be referred to as equipment that applies liquid with a brush, since the brush is wet with liquid in both systems.

Figure 4A:
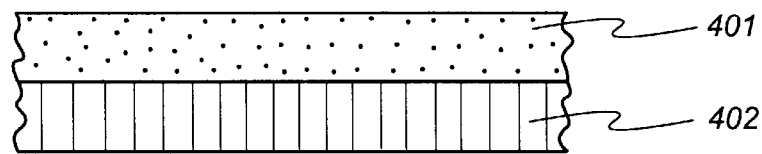
FIGS. 4A thru 4E show a method for forming a wire bond to a copper surface.
Figure 4B:
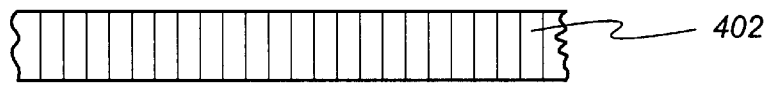
Figure 4C:
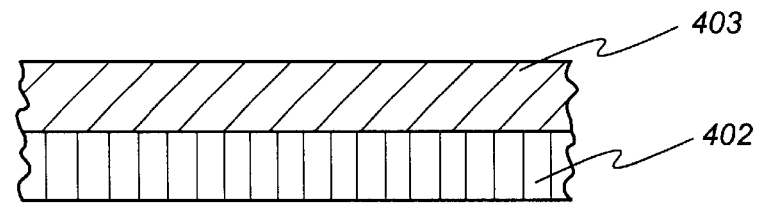
Figure 4D:
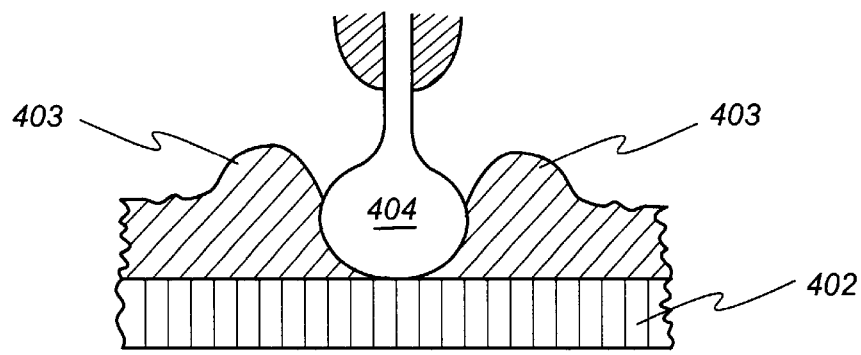
Figure 4E:
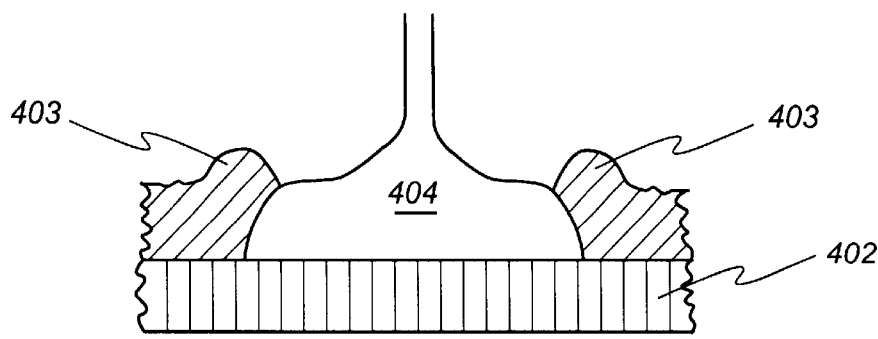

The discussion below describes various methods and apparati that may be employed to address one or more problems, such as the oxide formation problems, that occur on copper bonding pads for semiconductor ICs. Generally, referring to FIG. 4, the native oxide 401 is first removed from the bond pad 402 (as shown in FIGS. 4a and 4b) and then a passivation layer 403 is immediately (i.e., commenced within 5 seconds or less) formed over the bond pad 402 (as shown in FIG. 4c). Since the passivation layer covers the bond pad, it prevents native oxide formation during transport and downstream processing (such as testing, dicing, thermal annealing etc.). Furthermore, the passivation layer is designed such that the wire bond 404, when its bonded, may be bonded through the passivation layer to the copper pad (as shown in FIGS. 4d and 4e). As such, the passivation layer also does not significantly interfere with the integrity of the bond formed between the wire bond and the copper bonding pad. The passivation layer is therefore a barrier to native oxide formation, while permitting the wire bonding.

In order to prevent native oxide formation on the bonding pad, the passivation layer has enough thickness and density to adequately prevent the interaction of oxygen ambients with the surface of the copper pad. Furthermore, in order to be transparent to the wire bonding process, the passivation layer is not too thick (such that its presence significantly interferes with the wire bonding to the extent that the bond's integrity falls beneath acceptable standards). Thus the thickness and density have a first bound determined by oxide growth dynamics and a second bound determined by wire bonding dynamics.

Furthermore, passivation layers are different from adhesion and/or barrier layers. A form of adhesion layer is the aforementioned metal film (such as Ni/Au or Ni/Pd) deposited over the copper pad before the wire bond. Adhesion layers are a transition layer between the copper bond pad and the wire bond itself. That is, the wire bond and the copper pad each adhere only to the transition layer which ultimately promotes overall mechanical connection of the wire bond to the die. However, since the adhesion layer is deliberately used to prevent direct contact between the copper pad and the wire bond, it must be conductive. With adhesion layers, electrical current does not flow directly to/from the bond pad from/to the wire bond without traversing the adhesion layer.

By contrast, the passivation layer discussed herein is designed to be punched through by the wire bonding process. As such there is some direct contact between the wire bond and the conducting pad. Thus, with passivation layers, current may or may not flow through the passivation layer since at least some current flows directly to/from the bond pad from/to the wire bond.

As discussed, after the final metallization and its associated polish, the wafer is typically further subjected to cleaning, drying, testing, dicing and thermal annealing. After the individual chips are diced, each one is typically placed in a chip carrier and then epoxied to its package prior to wire bonding. The native oxide may be removed and the passivation layer applied anywhere within the aforementioned process. For example, after testing, the wafer may be subjected to an oxide removal step followed by a passivation layer application step.

As discussed, native oxides form rapidly on copper that is exposed to environments that comprise oxygen (such as air or water). Thus, in such an environment, once the native oxide is removed, the passivation layer should be applied as soon as practicable in order to reduce native oxide regrowth. Alternatively, the native oxide may be removed in an oxygen free and/or reducing environment. Lacking ambient oxygens, native oxides may not grow, allowing for greater delay between the removal of the native oxide and the application of the passivation layer (provided the environment remains oxygen free for the duration of the delay).

As discussed ahead, the removal of the oxide step as well as the application of the passivation layer may be performed in any of a number of ways known in the art (such as baths, sprays etc.). However, one embodiment involves use of a brush scrubber (described in reference to FIGS. 2 and 3) as the apparatus for both removing the oxide and applying the passivation layer.

The discussion above concerning the operation of the scrubber system suggests at least seven process parameters may be involved in the application of solutions through scrubbing brushes: 1) the rotational speed of the brush (i.e., brush speed); 2) the shear force of the brush (i.e., brush force) which typically correlates with the height of the brush over the wafer and the type/shape of bristles on the brush; 3) the speed of the rollers (i.e., roller speed) used to rotate the wafer beneath the brush(es); 4) the length of time a wafer spends in a station (i.e., process time); 5) the flow rates of the liquids applied to the brushes (i.e., flow rate); 6) the solution composition as well as the various concentrations of the specific solutions applied and finally, 7) the temperature.

Generally, for any system, the roller speed and wafer process time determine the number of rotations a wafer makes beneath the brush. The roller speeds and wafer process times described herein were performed on 200 mm diameter wafers in a system having 40 mm diameter rollers.

The following discussion addresses these parameters settings for both the removal of a copper native oxide as well as the application of a passivation layer. As discussed, brush scrubbing systems are traditionally used for cleaning wafers. This involves the removal of contaminants in the form of discreet particulate and/or film-like residue as well as the cleaning solution itself (during the rinse, spin and dry stage). The following described method, however, involves the unique application of brush scrubbing technology to the intentional deposition of a thin film layer (e.g., the passivation layer) to a wafer surface. Furthermore, the discussion herein is also unique in that it teaches the formation of an ultra thin layer (such as 20 Å or less). As discussed ahead, however, processes may be varied to obtain layers of thickness above or below 20 Å. Even further, ultra thin layers are created with a wet chemistry process (i.e., the application of liquids to a wafer process). Typically, wet chemistry processes (such as sprays or baths) produces film thicknesses on the order of microns. Thus, the use of a brush within a brush scrubbing system as a device to apply a layer of material involves a number of unique contributions. Consistent with this, the apparatus of FIG. 2 may now also be viewed simply as a brushing system as opposed to only a brush scrubbing system.

In most cases wafers require cleaning (with brush scrubbers as discussed above) after CMP. The oxide removal and passivation layer application steps may be applied immediately after this wafer cleaning step. In such an instance, the wafers may be reinserted into the wafer input cassette 280 (referring briefly back to FIG. 2) immediately after they are removed from the output cassette 281 (the system having just performed the post CMP wafer cleaning). Also, industry trends are currently integrating CMP polishers with brush cleaning systems. Integrated systems may or may not prohibit reuse of the wafer brush cleaning apparatus (depending on accessibility of the brushing station input cassette). If an integrated system prohibits individual brush scrubbing use, a separate stand-alone brush scrubber may be employed to implement the method described ahead. In alternate embodiments, as previously suggested, the oxide removal and passivation layer application may also be inserted at other manufacturing stages, besides just after CMP, such as just after wafer testing or just prior to wire bonding or in a rework cycle which includes these process steps. Furthermore, in other possible alternative embodiments, it may be necessary to passivate copper metallization beneath the highest metal level (such as the first or second metal layers). The invention herein may also be used for such an application.

The native oxide must be removed before the passivation layer is applied. The native oxide may be removed by a number of different solution chemistries. Usually, an acid or other solution is diluted in DI water. For example citric acid having a 0.2% concentration in DI water and a ph level of 2.0, hydrochloric acid (HCl) having a 0.1% concentration in DI water, malic acid having a 0.2% concentration in DI water or malonic acid having a 0.2% concentration in DI water may all be used where all concentration levels are by weight. Furthermore, each of these concentration levels may be varied depending on, for example, the thickness of the oxide to be removed or the desired processing time. Thus ranges at least as wide as 0.005% to 0.5% for citric, malic and malonic acids and 0.01% to 0.2% for HCl may also be used. Furthermore, any of the above described solutions may be further buffered by (i.e., also add) 100 ppm to 0.2% of ammonium hydroxide. Other solutions known in the art for removing oxides may also be applied.

The process time and solution flow rates may be typical values currently employed during standard wafer cleaning processes (such as a process time of 35 seconds and a solution flow rate of 500 cc/min). The general idea is that the wafer should be subjected to enough solution for enough time to substantially remove the oxide without causing damaging over etching effects to the material(s) residing beneath the oxide and to other features on the wafer. This guideline also extends to the above described acidic concentration levels. That is, higher acid concentration solutions should correspond to less process time and/or flow rates as compared to lower acid concentration solutions. Also consistent with this guideline, the employed brush speeds, roller speeds and forces may be typical of those used for oxide water cleaning such as 120 rpm, 40 rpm and 2.5 lbs respectively. Again, various ranges for these parameters are suitable provided the brushing is not too passive (resulting in under etched oxide) or too aggressive (resulting in wafer or feature damage). The temperature may be anywhere from room temperature to 50° C. Oxide removal dependence on temperature is generally: the higher the temperature, the greater the rate of removal.

After the oxide is removed the passivation layer is applied. Before discussing the specific processing parameters used within the brushing station to apply the layer, however, a brief discussion concerning the dynamics of the transport of the wafer will be helpful. As discussed, native oxides on copper have very aggressive growth rates. Essentially, in an environment having oxygen (such as the free air ambient within a brushing station), oxides begin to grow immediately after they are cleaned. As such, it is desirable to minimize the time between the removal of the oxide and the application of the passivating layer. As discussed, most scrubbing equipment is capable of transporting the wafer from the first to second station in 5 seconds or less. Generally, the quickest transport time achievable should be employed. As a rule of thumb, the transport time should consume 5 seconds or less. However, as discussed ahead, this time period may be extended depending on the amount of etchant left on the surface.

In a scrubbing system, the wafer moves horizontally from the first (i.e., oxide removal) brushing station 220 to the second (i.e., passivation layer application) brushing station 230 (referring briefly back to FIG. 2) on hardware beneath the wafer. That is, the wafer surface is perpendicular to the direction of gravity as it moves from the first 220 to second 230 station. Also, since the wafer is typically "rightside up" (meaning the devices and metallization are facing the upper brush(es) of the scrubber), and since the brush(es) are removed from the wafer surface before the wafer is transported to the second station; a coating of oxide removal solution (i.e., the solution employed in the first brush station) remains on the wafer surface as it moves from the first to second brushing station. This has a beneficial effect as discussed below.

If the brushes remained on the wafer surface as the wafer left the station the oxide removal solution would be wiped off of the wafer, especially if the solution flowing from the brushes ceased. If the solution were wiped off the surface, the copper bond pads would be exposed to free air resulting in immediate undesired oxide growth. However, since particular scrubbing systems (such as the Synergy™ brush scrubber from Ontrak Systems) simply lift the brushes in the first brushing station just before the wafer begins to exit, the wafer is not wiped clean, resulting in a protective "puddle" of oxide etching solution over the wafer surface which deters oxide formation during the wafer transport between the scrubbing stations.

Thus leaving the oxide removal solution over the wafer surface is desirable as it provides some margin for the time between oxide removal and passivation layer application. Nevertheless, given the rate of copper oxide growth, the passivation layer should be applied as soon as possible or practicable once the oxide is removed. Generally, the passivation layer should be applied within 5 seconds of the oxide removal step. Thus, equipment settings should be set to transport the wafer between stations but the puddle of etchant should provide some margin beyond this time.

As an alternate approach, the oxide removal solution as well as the passivation layer solution may be both applied within the first scrubbing station. That is, the oxide removal solution is first applied with a first station brush followed by a flow of the passivation layer solution with the same first station brush. This approach simplifies the procedure as the wafer does not require passage to a second station. Furthermore, the timing between application of the removal solution and application of the passivation layer solution is no longer limited by the hardware responsible for transporting the wafer from the first to second scrubbing station.

Continuing with the "two-station" approach as an example, once the wafer enters the second station a solution is immediately applied (through the brushes) that converts to a solid, stable passivation layer after exposure to the copper bond pad surface. The layer may also be referred to as a film. The solution chemistry is generally comprised of members of the azole family. Azoles, such as Benzotriazole (BTA), are known to provide protection against the growth of native oxides on copper. BTA is currently the most widely-used passivating agent for Copper and is the major component of many commercially available solutions used for copper oxide prevention (such as StopOx™ from Applied Chemical Technologies, Inc.). Other azoles that have been used for copper oxide prevention include Indazole, Benzimidazole, Indole and Methyl Benzotriazole. Furthermore, since PC board (PCB) technology employs copper interconnects, passivation chemistries based on triazole and imidazole (used in the Organic Solderability Preservatives (OSPs) used for PCB processes) may also be used.

BTA and other azoles form a protective layer according to a chemical reaction. Before the chemical reaction, pure BTA (or a diluted solution of BTA) is in a liquid state. However, upon exposure to copper, a chemical reaction causing a solid passivating film on the copper results. Particulates are any matter in a solid phase (which includes polymers). These particulates form the passivation layer. For BTA the chemical reaction is usually expressed as:

$$Cu_xO + BTA/H \rightarrow [Cu\text{-}BTA]_n + H_2O \qquad \text{Equation 1}$$

where $[Cu\text{-}BTA]_n$ is the solid film material and $Cu_xO$ is believed to result from the reaction of Cu with dissolved $O_2$.

As discussed, the thickness of the passivation layer may have a minimum bound necessary to substantially prevent further oxide growth and an upper bound necessary to remain transparent to the bonding process. The specific bonding parameters (such as frequency or time) needed to form acceptable bonds may vary depending on the bond tool manufacturer as well as the passivation layer thickness and its associated uniformity. Generally, more bonding energy may be needed as passivation layer thickness (or thickness variation) increases. As various bonding tools may be able to apply more or less energy (and/or vary other parameters) the upper bond of the passivation layer thickness may depend on the specific bonding tool employed.

As for the minimum bound, BTA passivation layer success is related to another important film characteristic (besides thickness): density. Thick layers of highly porous BTA would be an unacceptable passivation layer since the oxygen would make contact to the copper pad through the pores in the BTA film. Thus thin films of dense (i.e. low porosity) BTA are desirable. Film porosity is related to the coating techniques applied (such as the type of brush used, the brush speed, flow rates etc.). Generally, techniques that promote BTA coverage over the entirety of the wafer surface, rather than spotty or blotchy coverage, diminish porosity.

Consistent with this, BTA film density is related to the concentration level of BTA in the solution. Generally, higher concentrations of BTA tend to provide better BTA coverage over the wafer surface resulting in denser films. Higher BTA concentrations also yield thicker films since more BTA is available for the reaction expressed in Equation 1. Thus, higher levels of BTA concentration yield dense films (desirable) with greater thickness (undesirable).

In order to take advantage of the benefits of higher BTA concentrations (i.e., more dense films) while simultaneously reducing, or even minimizing, the potential detriments of higher BTA concentrations (i.e., thick films), BTA coating uniformity should be controlled. Thus not only should the application techniques promote BTA coverage (i.e., ensure at least a minimum amount of BTA is exposed over the entire wafer surface), the techniques employed should also promote uniformity of the coverage (i.e., minimize the variation in the amount of BTA coverage over the entire wafer surface).

Uniform coatings of concentrated BTA over the entire wafer surface help keep thickness down while ensuring dense films as discussed below. Films not exhibiting good uniformity tend to require higher concentrations of BTA in order to maintain acceptable density levels. Non uniform BTA coverage of highly concentrated solutions results in some wafer regions exposed to high amounts of BTA (resulting in thick film regions) and other wafer regions exposed to moderate amounts of BTA (resulting in less thick film regions). Thus the film is characterized as having uneven thickness across the wafer. In such a case, since the BTA concentration was high, both the thick regions and less thick regions have sufficient density to prevent oxide growth, however, the thick film regions tend to interfere with the wire bonding process. An even distribution of BTA will therefore maintain film density and minimize thickness across one entire wafer surface.

Thus, successfully applying a passivation film depends upon a combination of BTA concentration levels and the process parameters that affect uniformity of the BTA coverage about the target BTA film thickness (less than or equal to 20 Å). Uniform BTA coverage is achieved mostly through ensuring uniform coating of the solution comprising the BTA. Uniform solution coatings are achieved through higher wafer and brush rotation speed. Also, the shape of the brush affects uniformity. For example, flat brushes result in better global and local solution uniformity as compared to brushes with nodules.

In one embodiment, a passivation application process implemented with: a BTA concentration of 500 ppm in DI water and a ph of 7.0; a solution flow rate of 500 cc/min; a brush having nodule needles and a brush speed of 120 rpm; a roller speed of 40 rpm; a wafer process time of 35 seconds; a brush force of 1.5 lbs and a temperature of 25° C. resulted in acceptably dense films that varied between 15–20 Å in total thickness across the entire wafer. The minimum bound of the passivation layer thickness is met since it is thick enough to prevent oxide formation. Furthermore, the maximum bound is met since the film is thin enough to enable the wire bonding.

In another embodiment, a passivation application process implemented with: a BTA concentration of 100 ppm in DI water and a ph of 7.0, a solution flow rate of 500 cc/min; a flat brush at a-speed of 139 rpm; a roller speed of 40 rpm; a wafer process time of 35 seconds; a brush force of 1.5 lbs and a temperature of 25° C. resulted in acceptably dense, 15 Å films with little variation in thickness across the entire wafer surface.

In both the embodiments above, insubstantial oxide growth (10–40 Å) occurred beneath the BTA layer during high temperature curing of the test samples.

Finally, as discussed, the removal of the oxide and the application of the passivation layer do not necessarily require a brush scrubbing apparatus. Nor does the process require implementation immediately after the final CMP wafer clean step. For example, the oxide layer may be removed by an immersion (e.g., bath) process or by a spray process.

Baths involve completely immersing the wafer in an oxide etchant solution. Processing parameters include time, concentration, temperature and the amount of agitation (if any) applied to the bath. The solution chemistry the wafer is dipped into is generally the same as that used with the scrubber system. The time may range from seconds to minutes depending on the concentration of the solution and the amount of agitation supplied. Since oxide removal by bath is fairly well known in the art, specific processing parameters may be readily determined.

In another embodiment, the oxide may be removed by an acid spray. Sprays involve spraying the wafer with an etchant solution. The processing parameters associated with spraying include: volumetric flow rate of the solution, linear flow rate of the solution, the spray angle, the acidic concentration in the sprayed solution, the time and temperature. Again, since oxide removal by spray is fairly well known in the art, specific processing parameters may be readily determined.

The passivation layer may be applied by processes other than a brush scrubbing as well. These include, among others: immersion (such as baths), sprays and spin coats. Application of films by baths and sprays involve substantially the same parameters discussed above. Spin coats involve time, spin speed, flow rate and solution concentration. Again, since application of films by these methods are well known in the art, specific processing parameters may similarly be readily determined.

Finally, if process techniques other than a scrubbing system's are used (and unless the process is performed in an oxygen free environment), the passivation layer should be applied as quickly after the oxide is removed as possible or practicable. Again, within 5 seconds is a good rule of thumb. Furthermore, allowing the oxide etchant to remain on the wafer surface until the passivation layer is applied should similarly expand the allowable time margin between oxide removal and passivation layer application.

What is claimed is:

1. A bond pad in a semiconductor device, comprising:
    a metal bond pad layer;
    a passivation layer formed over the metal bond pad layer, the passivation layer being configured to cover the bond pad layer and prevent native oxide formation; and
    a wire bond bonded through the passivation layer and to the metal bond pad layer, the wire bond being a substantially uniform structure.

2. The bond pad of claim 1, wherein the metal bond pad layer is a copper bond pad layer.

3. The bond pad of claim 1, wherein the passivation layer is defined from a member of the azole family.

4. The bond pad of claim 3, the passivation layer is BTA.

5. In a semiconductor device, a copper bonding pad formed thereon, the copper bond pad comprising:
    a copper layer, the copper layer being substantially free of native copper oxide;
    a passivation film disposed over the copper layer that is substantially free of native copper oxide; and
    a wire bond being in contact with the copper layer, the passivation film surrounding the wire bond.

6. The copper bond pad of claim 5, wherein the passivation film has a thickness and density configured to prevent interaction of oxygen ambients with a surface of the copper layer.

7. The copper bond pad of claim 5, wherein the passivation film is configured to allow a wire to pass through the passivation film and bond to the copper layer to form the wire bond.

8. The copper bond pad of claim 5, wherein the passivation film is defined from a member of the azole family.

9. The copper bond pad of claim 8, wherein the passivation film is BTA.

10. A bond pad, comprising:
    a semiconductor chip;
    a copper layer defining a bond pad for receiving a wire bond; and
    a passivation layer disposed directly over the copper layer, the copper layer being substantially free of native copper oxide;
    wherein the wire bond being in direct contact with the copper layer of the bond pad, the passivation layer being contiguously defined around the wire bond.

11. The bond pad of claim 10, wherein the passivation layer has a thickness and density configured to prevent interaction of oxygen ambients with a surface of the copper layer.

12. The bond pad of claim 10, wherein the passivation layer is configured to allow a wire to pass through the passivation layer and bond to the copper layer of the bond pad to form the wire bond.

13. The bond pad of claim 10, wherein the passivation layer is defined from a member of the azole family.

14. The bond pad of claim 13, wherein the passivation layer is BTA.

15. The bond pad of claim 12, wherein the wire is comprised of one of gold and aluminum.

* * * * *